United States Patent
Yu et al.

(10) Patent No.: US 8,962,411 B2
(45) Date of Patent: Feb. 24, 2015

(54) CIRCUIT PATTERN WITH HIGH ASPECT RATIO AND METHOD OF MANUFACTURING THE SAME

(75) Inventors: Chien-An Yu, Taipei (TW); Yi-Fong Lin, New Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/570,253

(22) Filed: Aug. 9, 2012

(65) Prior Publication Data

US 2014/0041900 A1    Feb. 13, 2014

(51) Int. Cl.
*H01L 21/337* (2006.01)
(52) U.S. Cl.
USPC .......................................... 438/196; 438/404
(58) Field of Classification Search
CPC ................. H01L 27/10882; H01L 21/823431; H01L 21/176
USPC ................. 438/257, 283, 128, 196, 391, 404; 257/204, E27.084
See application file for complete search history.

(56) References Cited

U.S. PATENT DOCUMENTS

| | | | | |
|---|---|---|---|---|
| 7,352,018 B2* | 4/2008 | Specht et al. | | 257/204 |
| 7,879,677 B2* | 2/2011 | Lee | | 438/283 |
| 2005/0176186 A1* | 8/2005 | Lee et al. | | 438/157 |
| 2012/0040528 A1* | 2/2012 | Kim et al. | | 438/675 |
| 2012/0241411 A1* | 9/2012 | Darling et al. | | 216/67 |
| 2013/0234250 A1* | 9/2013 | Lin et al. | | 257/355 |
| 2013/0256799 A1* | 10/2013 | Wu et al. | | 257/347 |
| 2014/0197470 A1* | 7/2014 | Lee et al. | | 257/314 |
| 2014/0218839 A1* | 8/2014 | Gaddi et al. | | 361/278 |

FOREIGN PATENT DOCUMENTS

TW    200802817    1/2008

* cited by examiner

*Primary Examiner* — Jarrett Stark
*Assistant Examiner* — Shahed Ahmed
(74) *Attorney, Agent, or Firm* — Winston Hsu; Scott Margo

(57) ABSTRACT

A method of manufacturing a circuit pattern with high aspect ratio is disclosed. A plurality of parallel lines and supporting lines intersecting the parallel lines are formed. Supporting isolation structures are then formed in the space between the parallel lines and the supporting line for supporting the parallel lines in a later etching process. The parallel lines and the supporting line are then disconnected after the etching process.

9 Claims, 7 Drawing Sheets

CIRCUIT PATTERN WITH HIGH ASPECT RATIO AND METHOD OF MANUFACTURING THE SAME

BACKGROUND OF THE INVENTION

1. Field of the Invention

The present invention generally relates to a method of forming a circuit pattern. More particularly, the present invention relates to a method of forming a circuit pattern with high aspect ratio by using supporting circuit lines or isolation structures.

2. Description of the Prior Art

High aspect ratio (AR) silicon trench etching is a key process to manufacture trench capacitor DRAMs. The capacitance is directly proportional to the surface of the capacitor. The size reduction in the next technologies requires the capacitance to be kept at similar values while the corresponding critical dimensions (CDs) are reduced. To ensure a sufficient capacitance, the aspect ratio of the trenches has to be increased.

Many methods, such as reactive ion etching (RIE), have been proposed to manufacture the silicon trenches with significantly high aspect ratios. Trench structures with aspect ratio higher than 30, even 40 or 50 may be easily obtain with these methods. However, in the application of forming line structures, such as bit lines or word lines in DRAMs, line structures are vulnerable to the bending or collapse issue when the aspect ratio of the line structure is too large. These issues may be easily found in line structures that are subject to other following process, such as thermal oxidation process. The bending or collapse of the line structures may severely impact the electrical performances of the memory device. Conventional etching processes, such as the above-mentioned RIE process, can only form high AR line structures. They cannot prevent the bending or collapse issues during the process of forming high AR line structures.

Accordingly, it is still necessary to provide a novel method for forming the structures, especially islands or line patterns, with high or ultra-high aspect ratio.

SUMMARY OF THE INVENTION

To manufacture a circuit pattern with high or ultra-high aspect ratio, a new method of manufacturing a circuit pattern is provided in the present invention. The method of the present invention features the usage of supporting circuit lines or isolation structures to support the target circuit lines during the formation or any following processes. With the supporting properties, the circuit lines will not suffer from bending or collapse issues due to their increasing high aspect ratio, whether in current process or later processes.

One object of the present invention is to provide a process for forming a circuit pattern with high aspect ratio comprising the steps of: forming a circuit pattern comprising a plurality of parallel lines and at least one supporting line intersecting said parallel lines on a substrate, forming supporting isolation structures in the space between said parallel lines and said supporting line, and disconnecting said parallel lines and said supporting line after forming said isolation structures.

Another object of the present invention is to provide a process for forming a circuit pattern with high aspect ratio comprising the steps of forming a circuit pattern with a moderate aspect ratio comprising a plurality of parallel lines on a substrate by a 1st etching process, forming supporting isolation structures in the spaces between said parallel lines, removing parts of said supporting isolation structures so that parts of said substrate are exposed and parts of the isolation structures remain between said parallel lines, forming photoresist on said parallel lines and said remaining isolation structures, and then performing a 2nd etching process to etch said exposed substrate until a target of high aspect ratio of said circuit pattern is achieved.

Another object of the present invention is to provide a circuit pattern with high aspect ratio comprising a plurality of parallel lines having a high aspect ratio, a plurality of supporting isolation structures formed in the spaces between said parallel lines, and at least one supporting line intersecting said parallel lines, wherein said supporting line is disconnected from said parallel lines by gap structures cutting across said parallel lines and said isolation structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 7b and FIG. 7c show the cross-sectional views of the circuit pattern respectively taken along the line A-A' and line B-B' in FIG. 7a; and FIG. 9b and FIG. 9c show the cross-sectional views of the circuit pattern respectively taken along the line A-A' and line B-B' in FIG. 9a.

Figure 1:
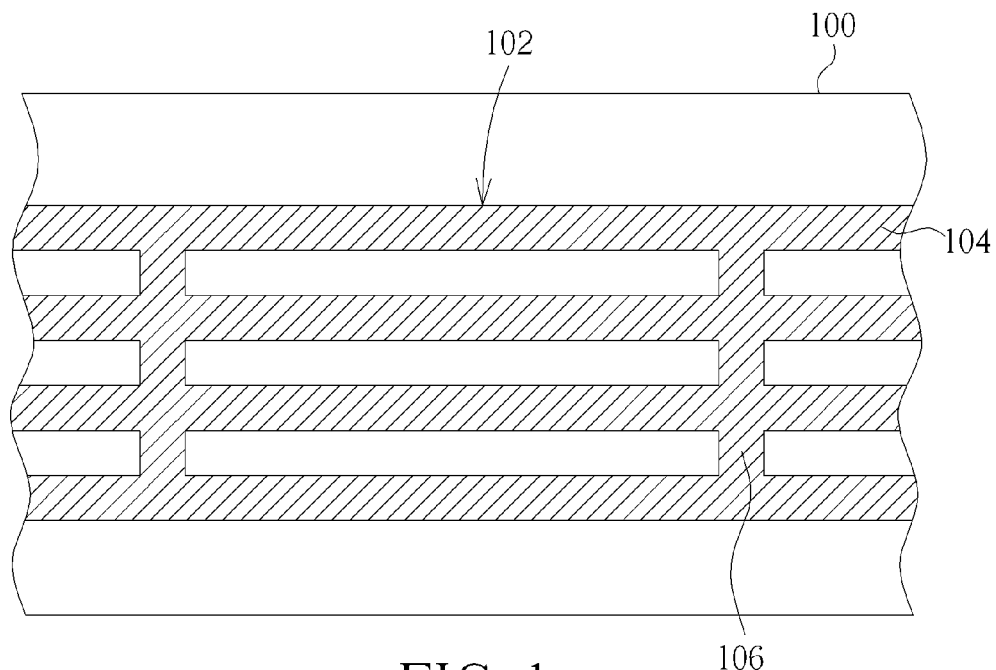
FIGS. 1-4 illustrates the manufacturing flow of a circuit pattern with high aspect ratio in accordance with the first embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part thereof, and specific embodiments are shown in which the invention may be practiced by way of illustration. These embodiments are described in sufficient details to allow those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention, wherein FIGS. 1-4 illustrate the manufacturing flow of a circuit pattern with high aspect ratio in accordance with the first preferred embodiment of the present invention; FIGS. 5-9 illustrate the manufacturing flow of a circuit pattern with high aspect ratio in accordance with the second preferred embodiment of the present invention.

First, please refer to FIG. 1. A semiconductor substrate 100 is provided to serve as a base for circuit patterns or layer structures to be formed thereon. The semiconductor substrate 100 may comprise a silicon substrate. In other embodiment, the substrate 100 may be, but not limited to, an epitaxial silicon substrate, a silicon germanium (SiGe) substrate, a silicon carbide (SiC) substrate, or a silicon-on-insulator (SOI) substrate. A circuit pattern 102 with high aspect ratio (ex. larger than 10) is formed on the substrate 100 by performing lithography and etching processes to a material layer on the substrate 100 or to substrate 100 itself. The circuit pattern 102 may comprise a plurality of parallel lines 104 and at least one supporting line 106 intersecting the parallel lines 104. Since the parallel lines 104 are formed together with the supporting line 106 in the same pattern, the parallel lines 104 are well-supported by the supporting line 106, thereby preventing the collapse or bending of the parallel lines 104 due to their large aspect ratio, during the entire forming processes, or any other following processes, such as thermal oxidation process.

In this preferred embodiment, the supporting line 106 is illustrated as being perpendicular to the parallel lines 104. However, in another embodiment, the supporting line 106 may intersect the parallel line 104 in a non-perpendicular manner as long as the supporting line 106 can provide sufficient mechanical strength to the intersected parallel lines 104. In the embodiment, the parallel line 104 may be a predetermined bit line or a word line in a DRAM structure, or any line structure with high aspect ratio in a circuit pattern.

Figure 2:
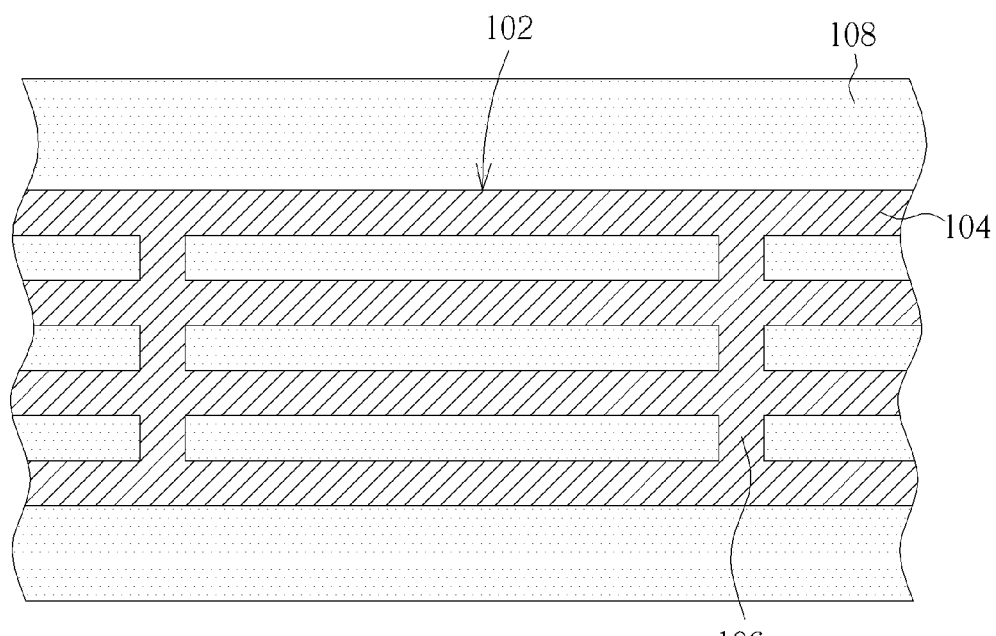

Please refer to FIG. 2. After forming the circuit pattern 102, isolation structures 108 (ex. shallow trench isolations, STI) are deposited into the spaces between the parallel lines 104 and the supporting lines 106. The isolation structures 108 in the present invention may serve as supporting structures between the parallel lines 104 formed in previous processes. The isolation structure 108 may be formed by first performing a chemical vapor deposition (CVD) process to deposit an isolating layer on the substrate 100 and then performing a chemical mechanical polishing (CMP) to thin down the isolating layer until the parallel lines 104 and the supporting lines 106 are exposed. The isolation material 108 may also be formed by spin-coating processes using low-k material precursor, such as hydrogen polysilozane, or other adequate method.

Figure 3:
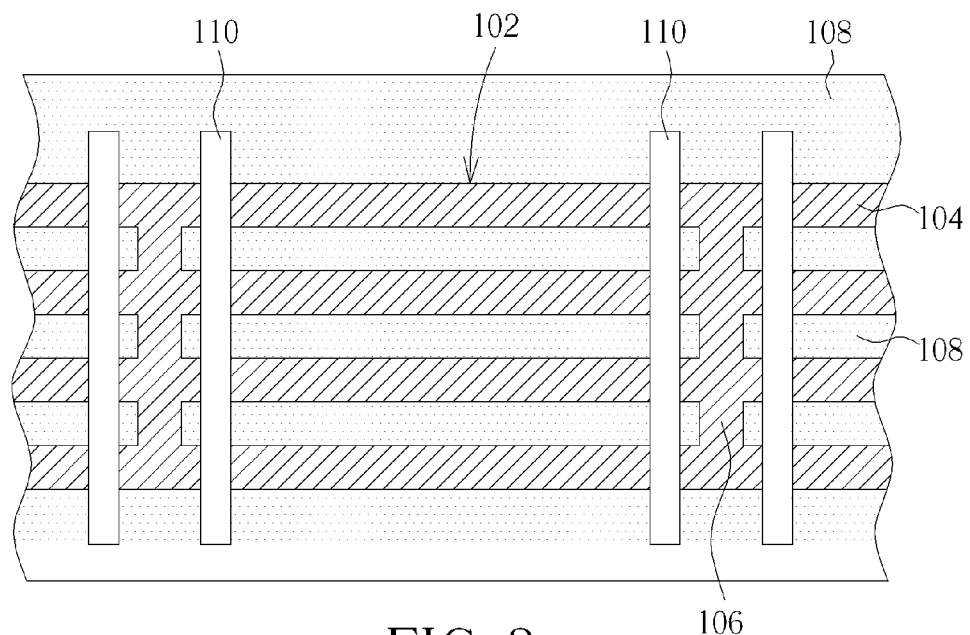
Figure 4:
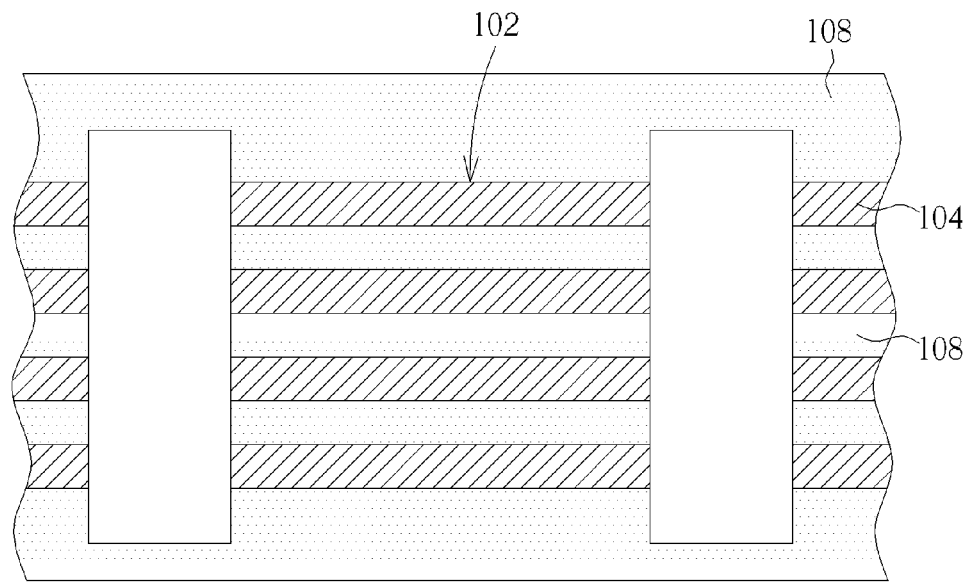
Figure 5:
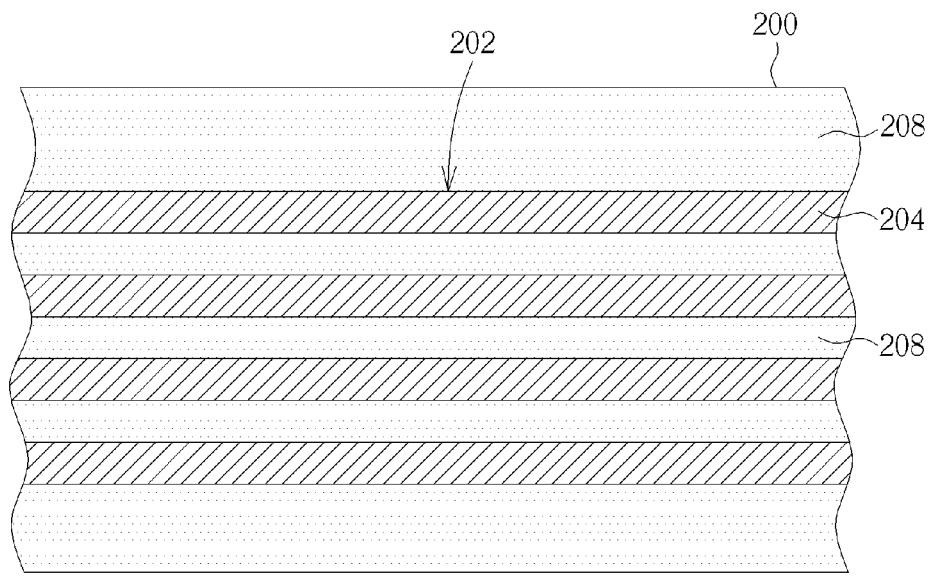
FIGS. 5, 6, 7a, 8 and 9a illustrate the manufacturing flow of a circuit pattern with high aspect ratio in accordance with the second embodiment of the present invention.

Please refer to FIG. 3. After forming the isolation structures 108 in the spaces between the parallel lines 104 and the supporting line 106, the parallel lines 104 and the supporting lines 106 are disconnected. As shown in FIG. 3, the parallel lines 104 and the supporting lines 106 may be disconnected through lithography and etching processes to form gap structures 110 cutting across the parallel lines 104 and the isolation structures 108. In an alternative embodiment, as shown in FIG. 4, the parallel lines 104 and the supporting lines 106 may be disconnected through lithography and etching processes to remove the entire supporting lines 106. Once the parallel lines 104 and the supporting line 106 are disconnected, the parallel line 104 is no longer supported by the supporting lines 106. Instead, it is supported by the isolation structures 108 on both sides, so that the parallel line 104 would not suffer bending or collapse issue due to their high aspect ratio in the following processes.

In present invention, the disconnected parallel lines 104 may be further patterned into pillar structures (not shown) which are arranged in an array, such as the cell array in memory structures. Those pillar structures may be used to form the component of a vertical memory cell structure. The component may comprise stacked capacitor, buried word line (BWL), buried digital line (BDL), gate-all-around (GAA) structure, or vertical transistor, etc.

By using the method of the present invention, it is possible to form a circuit pattern with a very high aspect ratio (ex. larger than 20), whether its shape is a line, a pillar, a block, or even an irregular shape, without inducing any bending or collapse issue. The formed circuit pattern will be supported by the adjacent isolation structures, thus it is possible to perform other following processes, such as further patterning, planarization, or oxidation processes, without inducing any bending or collapse issue.

FIGS. 5-8 illustrate the second embodiment of the present invention. First, please refer to FIG. 5; a circuit pattern 202 is first formed on a substrate 200 through a lithography and a 1st etching process. The circuit pattern 202 may comprise a plurality of parallel lines 204. In comparison with previous embodiments, no supporting line is formed for supporting the parallel lines 204 in the present embodiment. Moreover, the circuit pattern 202 in the present embodiment is formed with a moderate aspect ratio R1 (for example, half of the target aspect ratio) in the 1st etching process, which has therefore less probabilities to suffer bending or collapse issues due to large aspect ratio.

Please refer again to FIG. 5. After forming the circuit pattern 202, isolation structures 208 (ex. shallow trench isolations, STI) are deposited into the spaces between the parallel lines 204. The isolation structures 208 in the present invention may serve as supporting structures between the parallel lines 204. It may be formed by first performing a chemical vapor deposition (CVD) process to form an isolating layer on the substrate 200 and then performing a chemical mechanical polishing (CMP) to thin down the isolating layer until the parallel lines 204 are exposed. The isolation material 108 may also be formed through a spin-coating process using a low-k material precursor, such as hydrogen polysilozane, or any other adequate method.

Figure 6:
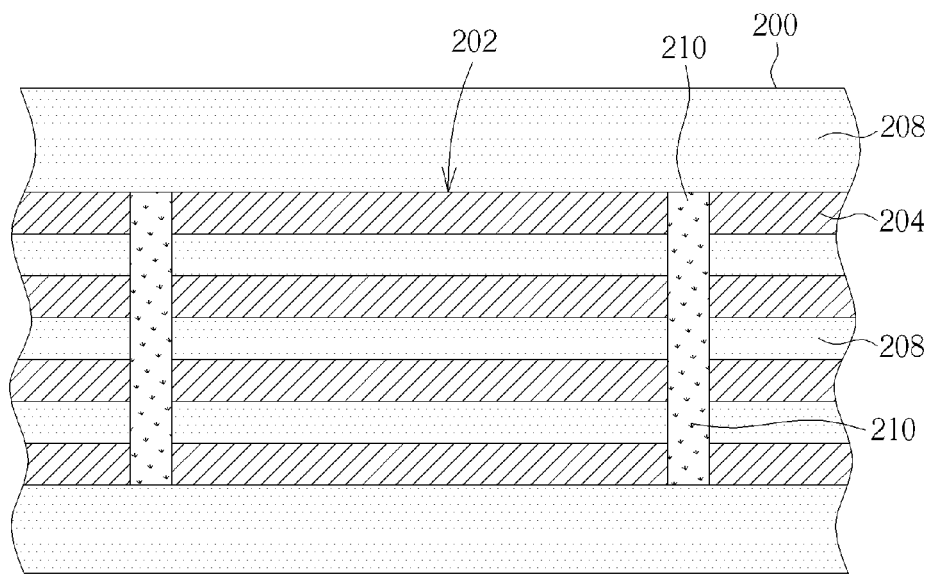

Please refer to FIG. 6. After forming the parallel lines 204 and the isolation structures 208, a patterned photoresist 210 is coated on the parallel lines 204 and the isolation structures 208. In the embodiment, the patterned photoresist 210 is formed to mask parts of the isolation structures 208 so that the isolation structures 208 exposed from the patterned photoresist 210 can be selectively removed by etching processes while the covered isolation structures 208 are kept during the etching process. In this embodiment, the patterned photoresist 210 is in the shape of, but not limited to, a plurality of elongated strips traversing the parallel lines 204 and the isolation structures 208. In other embodiments, the patterned photoresist 210 may have any kind of shape, or even be arranged non-perpendicularly to the parallel lines 204 and the isolation structures 208, as long as there are isolation structures 208 covered by the patterned photoresist 210 between the parallel lines 204, in order to form sufficient supporting structures for the parallel lines 204 in following processes.

Figure 7A:
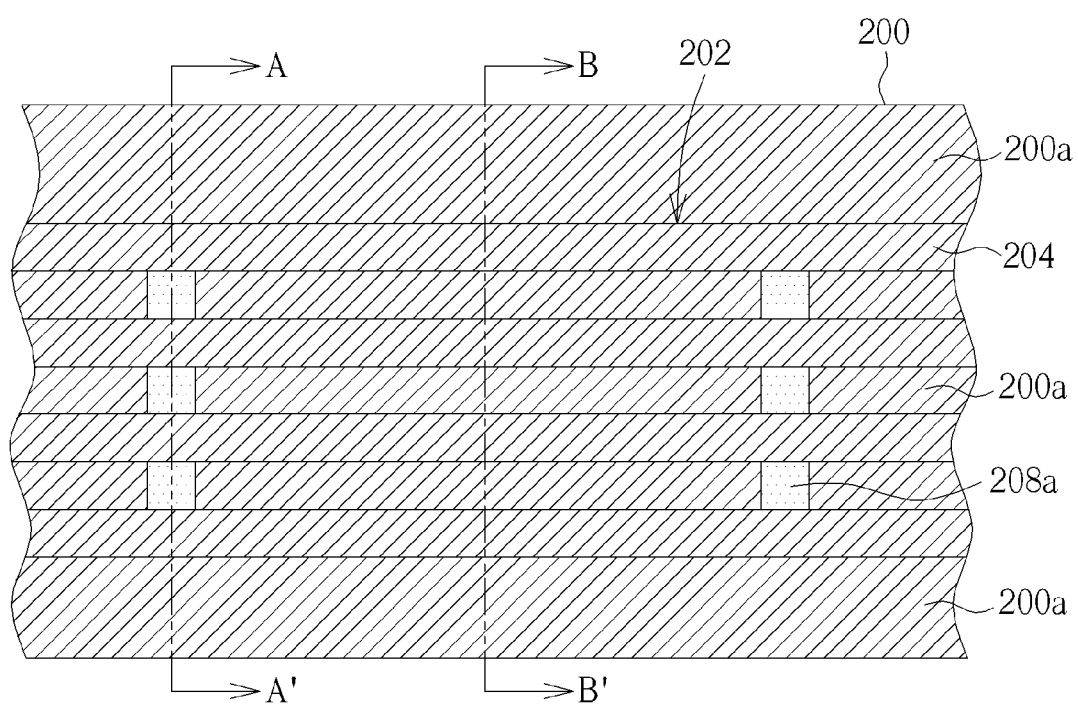

Refer again to FIG. 6. After the coating of the patterned photoresist 210, a selective etching process is performed to remove the exposed isolation structures 208 by using the patterned photoresist 210 as mask. The patterned photoresist 210 is then removed after the selective etching process. The selective etching may be achieved by selecting the materials having quite different etching rates under the same etching conditions for the parallel lines 204 and the isolation structures 208 respectively. The resulting structure after the selective etching is shown in FIG. 7a. The removal of the exposed isolation structures 208 exposes parts of the substrate 200a thereunder. This action enables the further etching process of the exposed substrate 200a for increasing the aspect ratio of the parallel lines 204 in following processes. The isolation structures 208a once covered by the patterned photoresist 210 still remains on the substrate between the parallel lines 204 after the selective etching process.

Figure 7C:
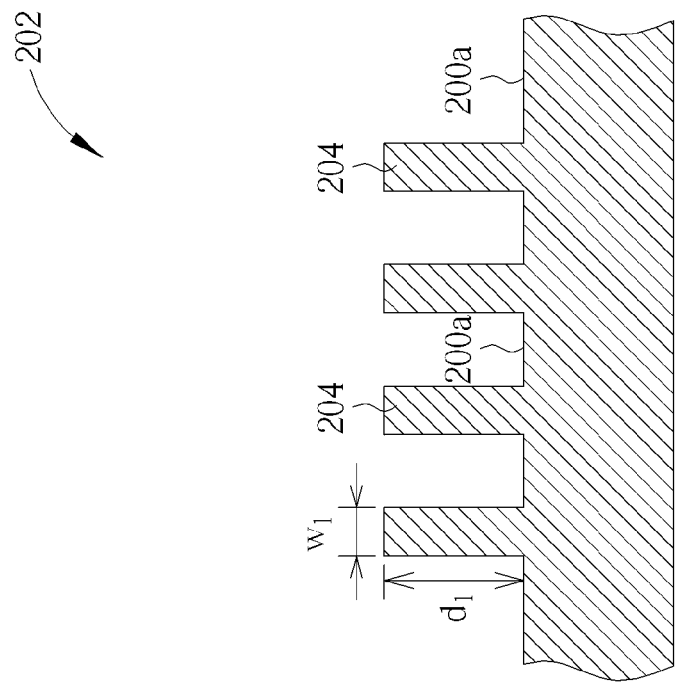
Figure 7B:
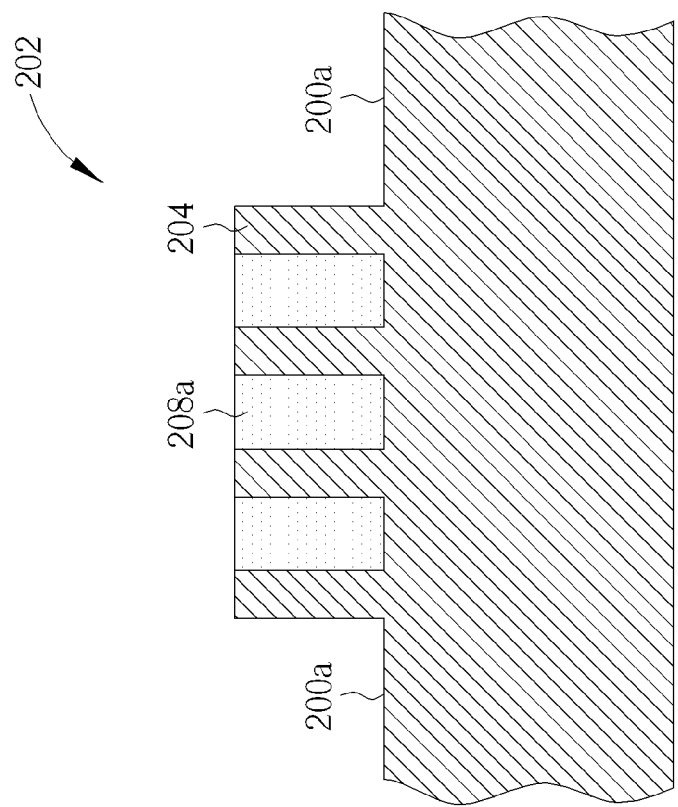

FIG. 7b and FIG. 7c show the cross-sectional views of the circuit pattern taken respectively along the lines A-A' and B-B' in FIG. 7a. As shown in FIG. 7b, parts of the substrate 200a are exposed after the removal the isolation structures 208 once covered thereon. The remaining isolation structures 208a will serve as supporting structures for the adjacent parallel lines 204 during the following etching process to ensure that the circuit pattern 202 will not bend or collapse along with the increase of the aspect ratio during the further etching processes. As shown in FIG. 7c, the circuit pattern 202 in this stage has the same moderate aspect ratio R1 (=$d_1/w_1$) defined during the formation of the parallel lines 204. The exposed substrate 202a will be subject to further etching steps in following processes until the target aspect ratio is achieved.

Figure 8:
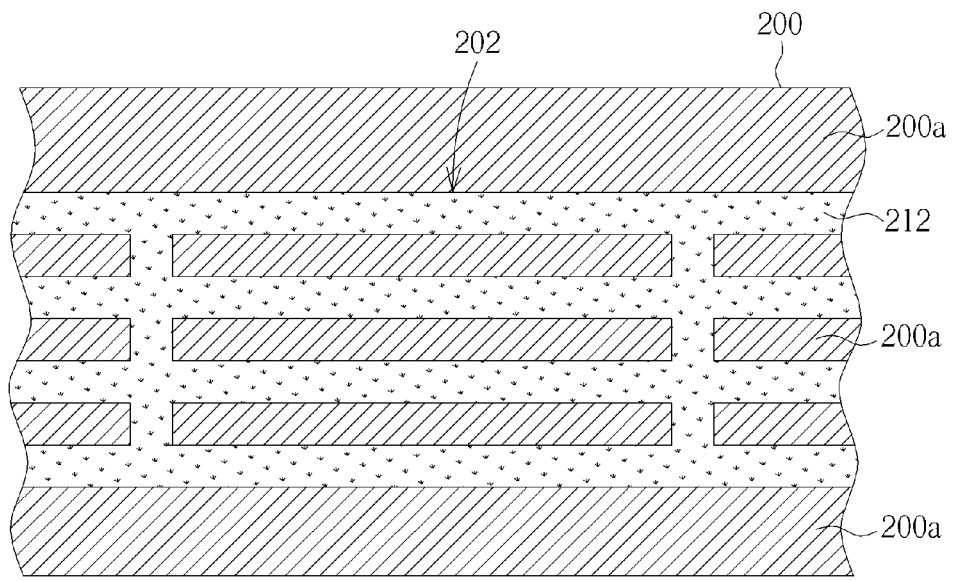
Figure 9A:
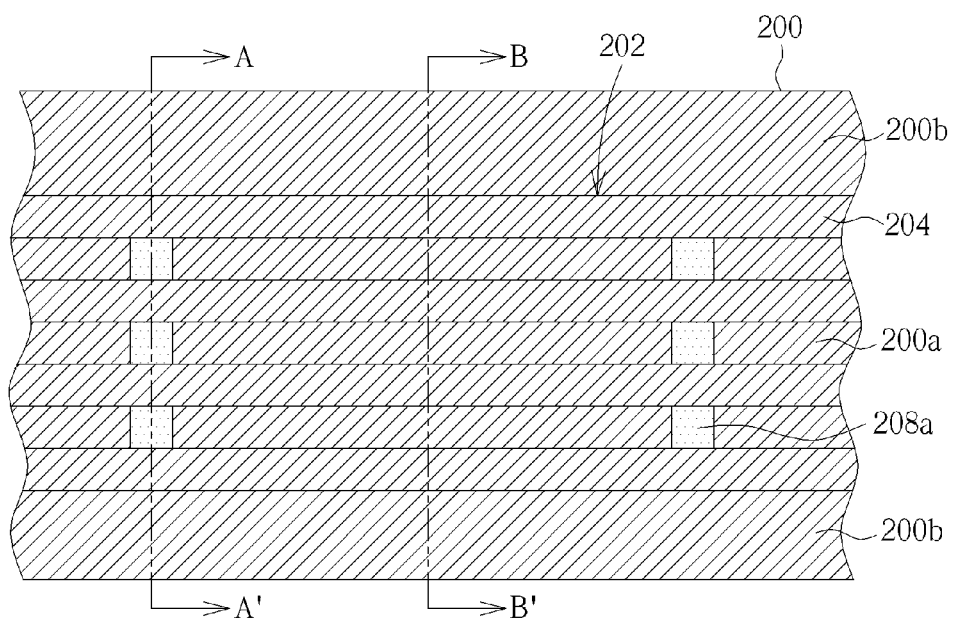

Refer now to FIG. 8; after forming the remaining isolation structures 208a and exposing parts of the substrate 202a, a patterned photoresist 212 is coated on the substrate to cover the parallel lines 204 and the remaining isolation structures 208a. The patterned photoresist 212 is used as a mask in the following 2nd etching process to further etch the exposed substrate 200a. The patterned photoresist 212 is then removed after said etching process. The resulting structure after the above processes is shown in FIG. 9a. This structure is similar to the structure shown in FIG. 7a except that the circuit patterns 202 in both figures have different aspect ratios R1 and R2.

Figure 9C:
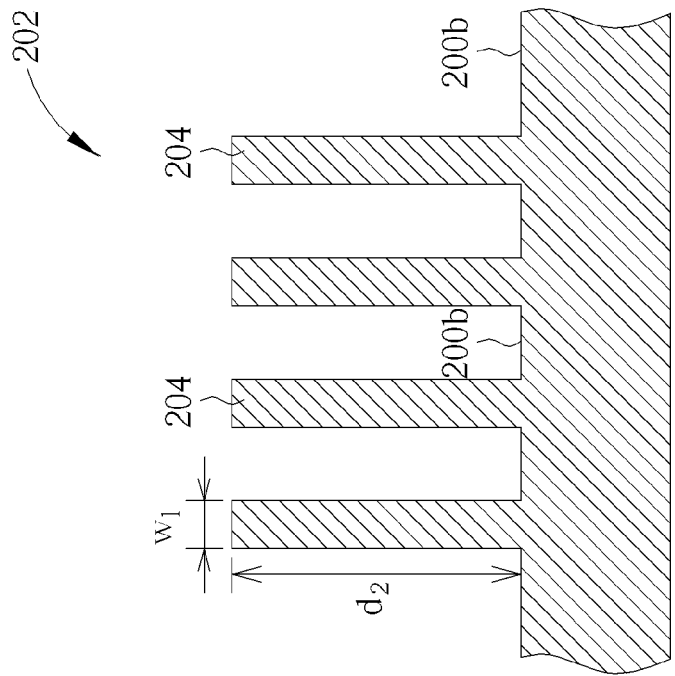
Figure 9B:
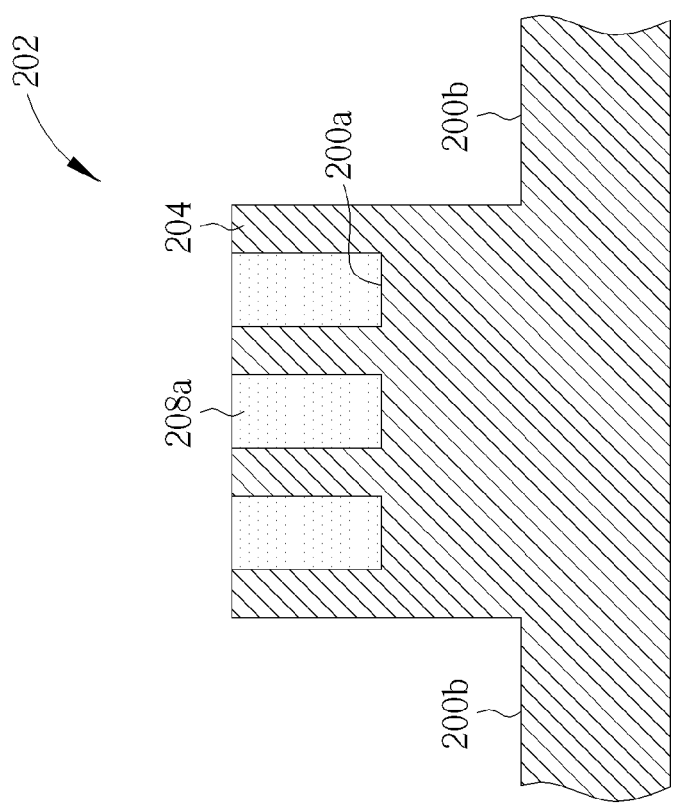

FIG. 9b and FIG. 9c show the cross-sectional views of the circuit pattern respectively taken along the line A-A' and the line B-B' in FIG. 9a. As shown in FIG. 9b, the substrate 200a covered by the remaining isolation structures 208a is not etched, while the substrate 200b exposed from the isolation structures 208a is further etched to a deeper level in the 2nd etching process. The remaining isolation structures 208a and the covered substrate 200a serve as the supporting structures for the parallel lines 204 in the 2nd etching process. As shown in FIG. 9c, the circuit pattern 202 in this stage is etched until a high aspect ratio R2 (=$d_2/w_1$) is achieved. The aspect ratio R2 may be several times higher than the aspect ratio R1.

In the present invention, the parallel lines 204 may be disconnected from the remaining isolation structures 208a and the covered substrate 200a. The disconnection may be achieved through performing lithography and etching processes to form gap structures cutting across the parallel lines 204, as the manner shown in FIG. 3.

Moreover, the parallel lines 204 may be further patterned into pillar structures (not shown) which are arranged in an arrays after the 2nd etching process, such as the cell arrays in memory structures. Those pillar structures may be used to form the components of a vertical memory cell structure. The components may comprise stacked capacitors, buried word lines (BWL), buried digital lines (BDL), gate-all-around (GAA) structures, or vertical transistors, etc.

In the second embodiment of present invention, the parallel line 204 is first etched to a shallow depth $d_1$, the isolation structures 208a are then formed adjacent to the parallel line 204 to serve as supporting structures. With the support of the isolation structures 208a, the parallel line 204 can be further etched to a deeper depth $d_2$ or undergo any following process, without inducing any bending or collapse issue.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process for forming a circuit pattern, comprising the steps of:
    forming a plurality of parallel lines and at least one supporting line intersecting said parallel lines on a substrate, wherein said plurality of parallel lines and said at least one supporting line are formed in a same material layer;
    after forming said plurality of parallel lines and said at least one supporting line, forming supporting isolation structures in the spaces between said parallel lines and said supporting line, wherein said supporting isolation structures has a top surface that is substantially flush with a top surface of said parallel lines and said at least one supporting line; and
    disconnecting said parallel lines and said supporting line after forming said isolation structures.

2. The process for forming a circuit pattern according to claim 1, wherein the step of disconnecting said parallel lines and said supporting line comprises removing said supporting line.

3. The process for forming a circuit pattern according to claim 1, wherein the step of disconnecting said parallel lines and said supporting line comprises forming gap structures cutting across said parallel lines and said isolation structures.

4. The process for forming a circuit pattern according to claim 1, further comprising patterning said parallel lines into a pillar array after disconnecting said parallel lines and said supporting lines.

5. The process for forming a circuit pattern according to claim 4, further comprising forming the component of a vertical memory cell structure after patterning said parallel lines into a pillar array, wherein said component comprises stacked capacitor, buried word line, buried digital line, gate-all-around (GAA) structure, or vertical transistor.

6. A process for forming a circuit pattern, comprising the steps of:
    forming a plurality of parallel lines on a substrate;
    forming supporting isolation structures in the spaces between said parallel lines, wherein said supporting isolation structures has a top surface that is substantially flush with a top surface of said parallel lines;
    using a first photoresist pattern as an etching mask and removing parts of said supporting isolation structures so that parts of said substrate are exposed and parts of the isolation structures remain between said parallel lines;
    removing said first photoresist pattern;
    forming a second photoresist pattern to completely cover said parallel lines and said remaining isolation structures; and
    etching said exposed substrate until a target high aspect ratio is achieved.

7. The process for forming a circuit pattern according to claim 6, further comprising disconnecting said parallel lines by forming gap structures cutting across said parallel lines after the target high aspect ratio is achieved.

8. The process for forming a circuit pattern according to claim 6, further comprising patterning said parallel lines into a pillar array after the target high aspect ratio is achieved.

9. The process for forming a circuit pattern according to claim 8, further comprising forming the components of a vertical memory cell structure after patterning said parallel lines into a pillar array, wherein said components comprise stacked capacitors, buried word lines, buried digital lines, gate-all-around (GAA) structures, or vertical transistors.

\* \* \* \* \*